(12) United States Patent
Hahn

(10) Patent No.: US 7,969,555 B2
(45) Date of Patent: Jun. 28, 2011

(54) LENS STRUCTURE, OPTICAL SYSTEM HAVING THE SAME, AND LITHOGRAPHY METHOD USING THE OPTICAL SYSTEM

(75) Inventor: Jae Won Hahn, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 618 days.

(21) Appl. No.: 12/010,708

(22) Filed: Jan. 29, 2008

(65) Prior Publication Data
US 2008/0273187 A1  Nov. 6, 2008

Related U.S. Application Data

(63) Continuation-in-part of application No. 11/662,934, filed on Mar. 16, 2007.

(30) Foreign Application Priority Data

May 1, 2007 (KR) .................. 10-2007-0042270

(51) Int. Cl.
*G03B 27/54* (2006.01)
*G03B 27/42* (2006.01)
(52) U.S. Cl. ........................... 355/67; 355/53
(58) Field of Classification Search .............. 355/30, 355/53, 55, 67; 359/359, 368, 642, 661
See application file for complete search history.

(56) References Cited

U.S. PATENT DOCUMENTS

| 6,324,149 | B1 | 11/2001 | Mifune et al. | |
| 7,408,620 | B2* | 8/2008 | Sumiyoshi | 355/53 |
| 7,697,111 | B2* | 4/2010 | Shirai et al. | 355/53 |
| 2005/0094119 | A1* | 5/2005 | Loopstra et al. | 355/67 |
| 2005/0110973 | A1* | 5/2005 | Streefkerk et al. | 355/72 |
| 2007/0201011 | A1* | 8/2007 | Kokubun et al. | 355/53 |

FOREIGN PATENT DOCUMENTS

| KR | 1020010103476 | 11/2001 |
| KR | 1020050001086 | 1/2005 |
| KR | 1020050063857 | 6/2005 |

OTHER PUBLICATIONS

International Search Report, Korean Intellectual Property Office, Mar. 8, 2006 (PCT/KR2004/002379).
Shi, Xiaolei, A Nano-aperture with 1000x Power Throughput Enhancement for Very Small Aperture Laser System (VSAL), Optical Data Storage 2001, pp. 320-327, Proc. SPIE vol. 4342.

* cited by examiner

*Primary Examiner* — Hung Henry Nguyen
(74) *Attorney, Agent, or Firm* — Venable LLP; Jeffri A. Kaminski

(57) ABSTRACT

Disclosed are a lens structure, an optical system including the same, and a lithography method using the optical system. The disclosed lens structure includes: a lens that has a substantially semispherical shape and includes a protruding portion having a truncated cone shape that is provided on its aspherical surface; a thin metal film that is formed on the surface of the protruding portion, and has an aperture formed at a position corresponding to the center of an upper surface of the protruding portion; and an immersion layer that is formed with a constant thickness on the upper surface of the protruding portion.

11 Claims, 7 Drawing Sheets

LENS STRUCTURE, OPTICAL SYSTEM HAVING THE SAME, AND LITHOGRAPHY METHOD USING THE OPTICAL SYSTEM

This application is a continuation-in-part of U.S. patent application Ser. No. 11/662,934 filed on Mar. 16, 2007.

BACKGROUND OF THE INVENTION

1. Technical Field

The present invention relates to a lithography technique, and more particularly, to a lens structure, an optical system including the same, and a lithography method using the optical system.

2. Related Art

It is essential to use a lithography process for forming a pattern to manufacture electronic devices, such as semiconductor integrated circuit devices and display devices. In such a lithography process, a photo mask, which is generally called a reticle, can be used. An image formed on the photo mask is projected onto a semiconductor substrate (a so-called wafer or glass substrate) having a photoresist material applied thereon by a projection optical system. In recent years, a step and repeat method of synchronously scanning the reticle and the wafer with light has been generally used.

The projection optical system is provided in an exposure apparatus. The resolution of the optical system increases as the wavelength of exposure light used is shortened and the numerical aperture (NA) of the projection optical system increases. Therefore, with an improvement in the degree of integration of an integrated circuit, the wavelength of exposure light used in the projection optical system has been shortened, and the numerical aperture of the projection optical system has increased. In recent years, a KrF excimer laser having a wavelength of 248 nm or an ArF excimer laser having a wavelength of 193 nm has been generally used as an exposure light source.

In the lithography process, the most important factors are resolution and the depth of focus (DOF). The resolution (R) and the depth of focus (δ) are calculated by Expressions 1 and 2 given below:

$R = k1 \cdot \lambda / NA$, and  [Expression 1]

$\delta = k2 \cdot \lambda / NA^2$  [Expression 2]

(where λ indicates the wavelength of exposure light, NA indicates the numerical aperture of the projection optical system, and k1 and k2 indicate process coefficients). According to Expressions 1 and 2, a trade off relationship is established between the resolution (R) and the depth of focus (δ). That is, when a light source emitting exposure light having a short wavelength λ and a projection optical system having a high numerical aperture are used in order to increase the resolution, the depth of focus (δ) decreases. In order to ensure a constant depth of focus (δ), an auto focus method is used to align the surface of a wafer with an image surface of the projection optical system, when the exposure processing is performed. However, in this case, it is difficult to obtain a sufficient depth of focus (δ). Therefore, various methods, such as a phase shift reticle method, an off-axis illumination method, and a multi-layer resist method, have been proposed in order to increase the depth of focus.

As described above, in the projection optical system according to the related art, the depth of focus has decreased with a reduction in the wavelength of exposure light and a widening of aperture of the projection optical system. In addition, it is expected that the wavelength of exposure light will be shortened as the degree of integration of an integrated circuit is improved in the near future. In this case, the depth of focus will be excessively decreased, which may cause an insufficient margin during an exposure operation.

Therefore, Korean Patent Laid-Open No. 10-2005-0001086 discloses "Two-dimensional light-modulating nano/micro aperture array and high-speed nano pattern recording system using the array" using an evanescent field in order to improve the resolution and lithography characteristics, which is filed by the applicant. In the two-dimensional light-modulating nano/micro aperture array, an aperture serves as a photo mask, and light focused through a fine aperture is transmitted to a recording medium (i.e., substrate) that is spaced from the aperture by a predetermined distance, thereby transferring an image onto the recording medium.

The two-dimensional light-modulating nano/micro aperture array uses an evanescent field to improve the resolution and performs exposure with the depth of focus being increased, which makes it possible to improve reliability. However, it is difficult to maintain a constant distance between the two-dimensional light-modulating nano/micro aperture array and a recording medium (i.e., substrate), that is, a constant focal distance. When the distance between the two-dimensional light-modulating nano/micro aperture array and the recording medium is not kept constant, a different exposure pattern may be formed even when light having the same intensity is incident.

SUMMARY OF THE INVENTION

An Embodiment of the present invention provides a lens structure capable of ensuring a constant distance from a recording medium.

Another embodiment of the invention provides an optical system provided with the lens structure.

Still another embodiment of the invention provides a lithography method using the optical system.

According to an embodiment of the invention, a lens structure includes: a lens that has a substantially semispherical shape and includes a protruding portion having a truncated-cone-shape provided on its aspherical surface; a thin metal film that is formed on the surface of the protruding portion, and has an aperture formed at a position corresponding to the center of an upper surface of the protruding portion; and an immersion layer that is formed with a constant thickness on the upper surface of the protruding portion.

According to another embodiment of the invention, there is provided a method of manufacturing a lens structure. The method includes: preparing a semispherical lens; cutting the edge of the lens to form a truncated-cone-shaped protruding portion on a flat portion on the bottom of the lens; forming, on the protruding portion, a thin metal film having an aperture at a position corresponding to the center of an upper surface of the protruding portion; and forming an immersion layer on the upper surface of the protruding portion.

The immersion layer may be a solid layer or a liquid layer formed of a transmissive material having a larger refractive index than air.

The method may further include forming a protective layer on the immersion layer.

According to still another embodiment of the invention, an optical system includes: a light source unit; a lens unit that focuses light emitted from the light source unit on a recording medium; and a stage onto which the recording medium is mounted.

The lens unit may include: an object lens that primarily condenses light emitted from the light source unit; a lens structure that focuses the light condensed by the object lens to a nanometer-diameter spot; and a holder that holds the object lens and the lens structure. The holder may include: a first housing to which the object lens is inserted and fixed; a support member that fixes the first housing to an inner wall of the system; a second housing to which the lens structure is inserted and fixed; and an elastic member that connects the second housing to the first housing, and minutely adjusts the position of the lens structure.

According to yet another embodiment of the invention, a lithography method includes: loading a recording medium having a resist material applied thereto on a stage of an optical system; preparing a lens structure that has a substantially semispherical shape, and includes a protruding portion having a truncated cone shape that is formed at the center of a flat surface, a thin metal film that has an aperture formed at a position corresponding the center of an upper surface of the truncated-cone-shaped protruding portion, and an immersion layer formed on the metal film; setting the lens structure in the optical system; bringing the lens structure into contact with the recording medium; and exposing the recording medium with light emitted from the optical system.

DESCRIPTION OF EXEMPLARY EMBODIMENT

Hereinafter, exemplary embodiments of the invention will be described with reference to the accompanying drawings.

The present invention provides a single lens structure that includes a nano-aperture and an immersion layer that makes the distance between a recording medium and a lens constant. The single lens structure can ensure a more constant focal distance than a lens array, and can be easily manufactured by a general lens manufacturing process, resulting in a reduction in manufacturing costs.

The single lens structure will be described in detail below.

Figure 1:
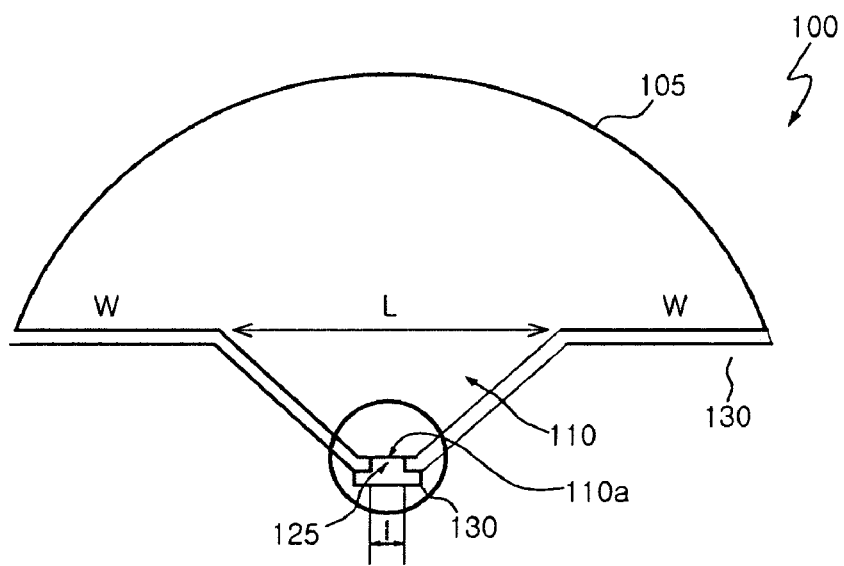
FIG. 1 is a cross-sectional view illustrating a lens structure according to an embodiment of the invention.

Referring to FIG. 1, a lens structure 100 according to an embodiment of the invention includes a main lens 105 having a substantially semispherical shape and a protruding portion 110 that protrudes from the bottom of the main lens 105. The protruding portion 110 may have a flat exposing surface, for example, the protruding portion 110 may be formed to have truncated-cone-shape. The truncated-cone-shaped protruding portion 110 is disposed at the center of the bottom of the main lens 105, and the protruding portion 110 and the main lens 105 are formed of the same material. Therefore, there is no boundary therebetween. The main lens 105 may have a diameter of about 1500 to about 3000 μm, and the protruding portion 110 may have a base with a diameter (L: a relatively large diameter) of about 1000 to about 1500 μm and an upper surface 110a with a diameter (I: a relatively small diameter) of about 10 to about 60 μm. Therefore, the bottom of the main lens 105 at both sides of the protruding portion 110 has a length w of about 500 to about 2000 μm.

Figure 2:
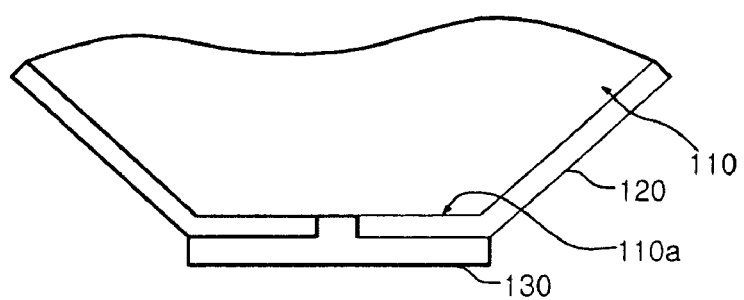
FIG. 2 is an enlarged cross-sectional view illustrating a protruding portion of the lens structure shown in FIG. 1.

As shown in FIG. 2, the surface of the protruding portion 110 of the lens structure 100 is covered with a thin metal film 120, and the thin metal film 120 has a nanometer-diameter aperture 125 formed in a portion thereof that is provided on the upper surface 110a of the protruding portion 110. Light passes through the aperture 125. A beam transmitted from a light source unit (not shown) is condensed by the lens structure 100, and the condensed light is incident on a recording medium (not shown) through the aperture 125. The thin metal film 120 may be formed of a material that little absorbs light components in the wavelength range of visible light and easily generates surface plasmon. If necessary, the thin metal film 120 may be opaque with respect to incident light. For example, when a light source emitting light in a wavelength range of 400 nm is used, an aluminum (Al) film may be used as the thin metal film 120. When a light source emitting light in a wavelength range of 600 nm is used, a gold (Au) film may be used as the thin metal film 120. Therefore, a nano-aperture is formed to improve transmittance of the thin metal film 120 and to form a small and bright light spot ("A nano aperture with 1000× power throughput enhancement for VSAL system", 2002, SPIE Vol. 4342). According to this principle, when a nano-aperture having a special structure is formed in the thin metal film 120, it is possible to obtain high transmittance and a small light spot.

When light is incident through a general nano-aperture, an evanescent field is formed in the vicinity of the aperture, and light passing through the aperture is scattered at a large angle due to diffraction. Therefore, it is preferable that the lens structure 100 approach a recording medium (not shown) at a distance of about 100 nm or less, for example, at a distance of 10 to 100 nm, in order to use the evanescent field formed in the vicinity of the aperture. However, actually, it is difficult to arrange the lens structure 100 close to a recording medium (not shown) at a distance of about 100 nm or less and rapidly perform a process whiling maintaining the distance in an optical system. In addition, it is difficult to achieve an apparatus for performing a process whiling maintaining a short distance therebetween at a low cost. For this reason, in this embodiment, an immersion layer 130, which is a member for maintaining the distance therebetween, is formed on the upper surface 110a of the protruding portion 110. The immersion layer 130 is optically transparent and has a refractive index larger than that of air. When the immersion layer 130 comes into contact with a recording medium (not shown), it is possible to separate the lens structure 100 from the recording medium (not shown) at a distance corresponding to the thickness of the immersion layer 130, without adjusting the distance.

Figure 3:
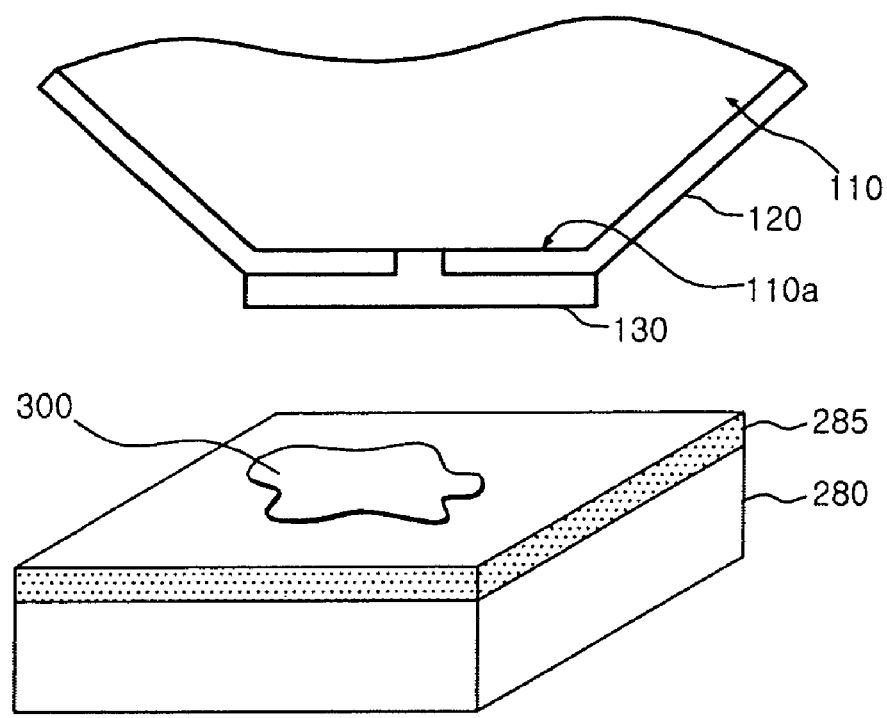
FIG. 3 is a cross-sectional view illustrating a lens structure including an immersion layer according to another embodiment of the invention.

As shown in FIGS. 1 and 2, the immersion layer 130 may be formed on the upper surface 110a of the protruding portion 110. The immersion layer 130 may be formed of a solid material, such as an ultraviolet cured resin or a polymer, or a liquid material. When the immersion layer 130 is in a solid state, as shown in FIG. 3, a lubricant 300 may be applied on a photoresist 285 formed on a recording medium 280. Thus, a surface friction between the immersion layer 130 and a photoresist 285 is prevented by the lubricant 300.

Figure 4A:
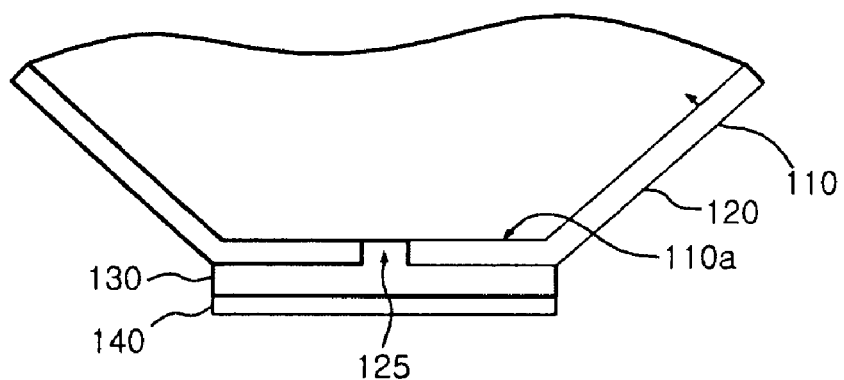
FIG. 4A is a cross-sectional view illustrating the lens structure including a protective layer according to another embodiment of the invention.

Further, as shown in FIG. 4A, a protective layer 140 may be formed on the immersion layer 130. For example, a diamond like carbon (DLC) layer having good friction characteristics may be used as the protective layer 140.

Figure 4B:
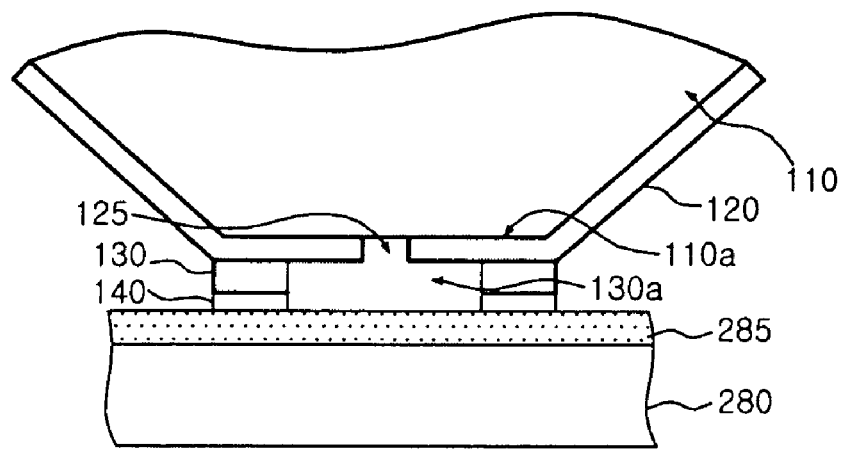
FIG. 4B is a cross-sectional view illustrating the lens structure including an immersion layer having a liquid state according to another embodiment of the invention.

When the immersion layer 130 is in a liquid state (hereinafter, referred to as a liquid immersion layer 130a), as shown in FIG. 4B, the protective layer 140 and the solid-state immersion layer 130 may be partially removed such that the aperture 125 is exposed, thereby forming a hole. Then, the liquid immersion layer 130a may be filled into the hole. In this case, the hole may communicate with the aperture 125, and have a larger diameter than the aperture. When the liquid immersion layer 130a is used, a separate lubricant is not needed. In this embodiment, a laminate of the protective layer 140 and the solid-state immersion layer 130 is provided as a guard at both sides of the liquid immersion layer 130a. However, only the protective layer 140 or the solid-state immersion layer 130 may be provided at both sides of the liquid immersion layer 130a.

Next, a method of manufacturing the lens structure will be described with reference to FIGS. 5 to 9.

Figure 5:
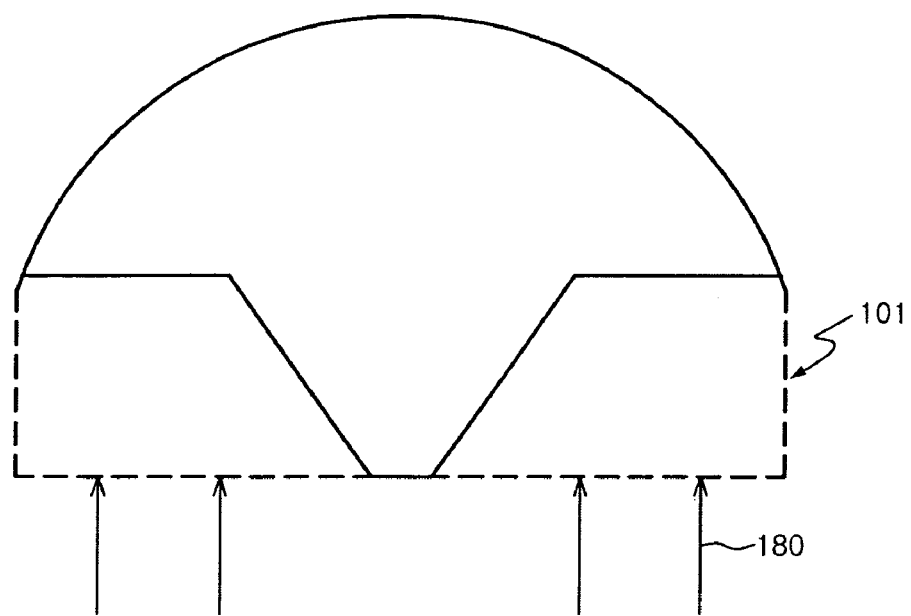
FIGS. 5 to 9 are cross-sectional views illustrating a method of manufacturing a lens structure according to an embodiment of the invention.
Figure 6:
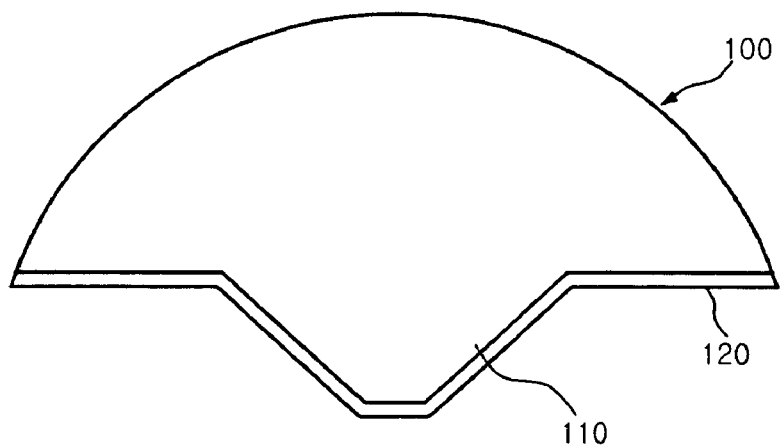

First, as shown in FIG. 5, a raw optical lens 101 is prepared. In general, the optical lens 101 may have a semispherical shape. For example, a diamond turning machine is used to cut the edge of the optical lens 101 by a thickness of about 310 to 350 μm, thereby forming the lens structure 100 with the truncated-cone-shaped protruding portion 110, as shown in FIG. 6. Referring to FIG. 6, the thin metal film 120 is formed on the surface of the lens structure 100 with the protruding portion 110. For example, a thin aluminum film may be used as the thin metal film 120, and the thin metal film 120 may be formed by a sputtering method or a chemical vapor deposition method.

Figure 7:
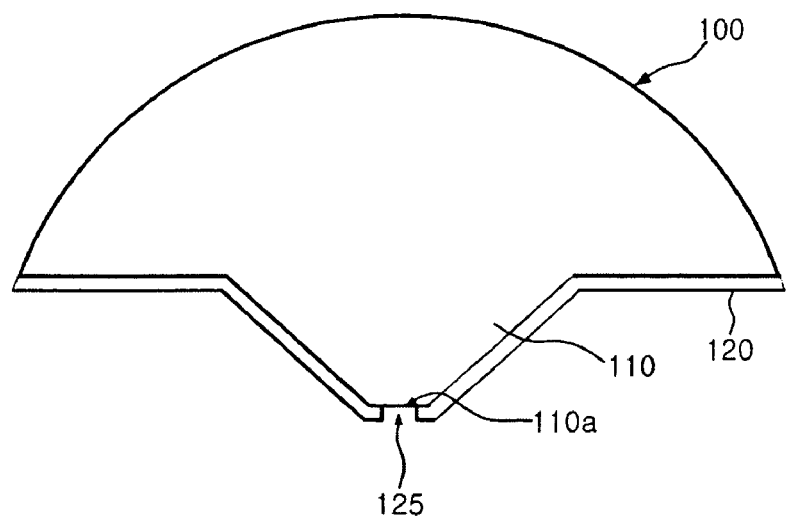

Referring to FIG. 7, the thin metal film 120 is patterned such that a portion thereof corresponding to the center of the upper surface 110a of the protruding portion 110 is exposed, thereby forming an aperture 125. In this case, it is preferable that the width of the aperture 125 be equal to or smaller than 100 nm. The thin metal film 120 may be patterned by a general photolithography method and an etching process, or an optical lithography method.

Figure 8:
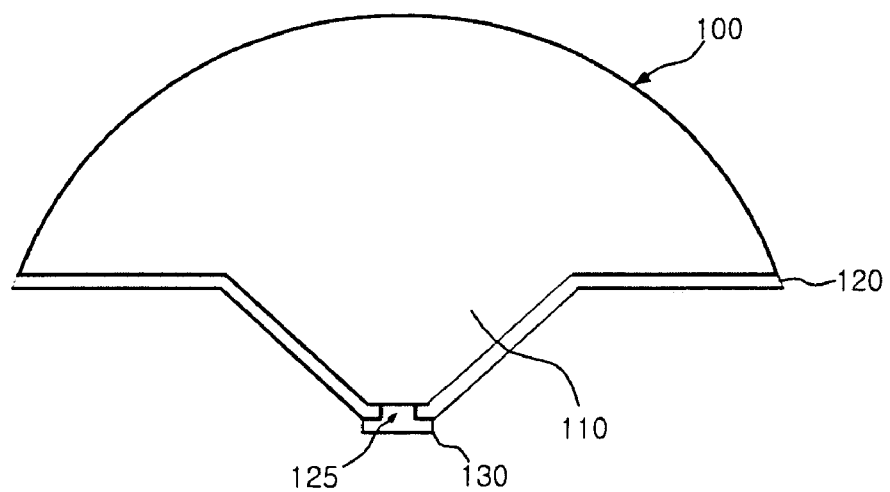

As shown in FIG. 8, the immersion layer 130 is formed on the upper surface of the thin metal film 120 having the aperture 125 formed therein. As described above, the immersion layer 130 may be formed of a solid material, such as a transparent photoresist, an ultraviolet cured resin, or a polymer. Then, the immersion layer 130 is patterned so that the immersion layer 130 is remained on only the upper surface 110a of the protruding portion.

Figure 9:
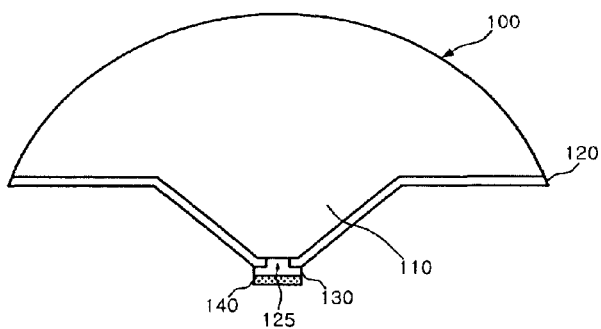

Referring to FIG. 9, the protective layer 140 may be formed on the immersion layer 130. As described above, the protective layer 140 is provided to prevent the damage of the immersion layer 130 when the immersion layer 130 comes into contact with a recording medium (not shown), and, for example, a diamond like carbon layer may be used as the protective layer 140. In this way, the lens structure 110 having a mask function is manufactured. The protective layer 140 may be selectively formed. When the immersion layer 130 and the protective layer 140 are sequentially formed, only one patterning process is needed to form the immersion layer 130 and the protective layer 140 on only the upper surface 110a of the protruding portion.

Figure 10:
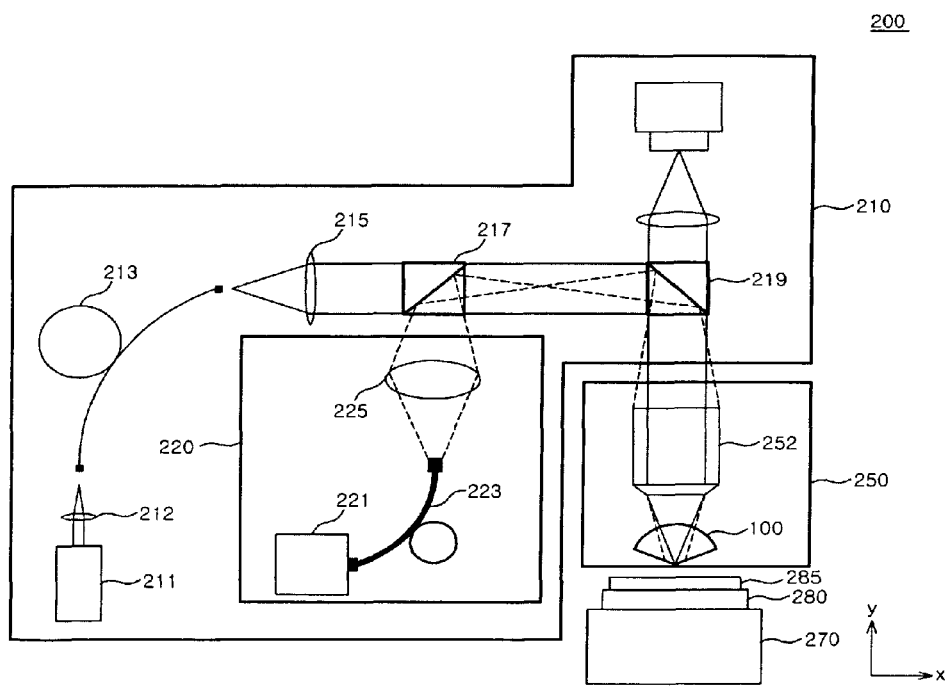
FIG. 10 is a cross-sectional view illustrating an optical system including a lens structure according to an embodiment of the invention.

FIG. 10 is a cross-sectional view illustrating an optical system provided with the lens structure according to the embodiment.

Referring to FIG. 10, an optical system 200 includes a light source unit 210, a lens unit 250, and a stage 270.

The light source unit 210 includes a light source 211, a polarization fiber 213, a collimator 215, and first and second beam splitters 217 and 219.

For example, a laser diode may be used as the light source 211, and the polarization fiber 213 transmits light emitted from the light source 211 to the collimator 215 while maintaining the polarization state thereof.

The collimator 215 converts light transmitted from the polarization fiber 213 into a parallel beam and transmits the parallel beam.

The first beam splitter 217 transmits the beam transmitted from the collimator 215 and reflects a beam transmitted from an additional illustrating system 220 to the second beam splitter 219 at a predetermined ratio.

The second beam splitter 219 transmits and reflects the beams transmitted from the first beam splitter 217 to the lens unit 250 at a predetermined ratio.

The additional illustrating system 220 includes a light source 221, an optical fiber 223 that transmits beams emitted from the light source 221, and a lens 225 that condenses the beams transmitted from the fiber 223.

Figure 11:
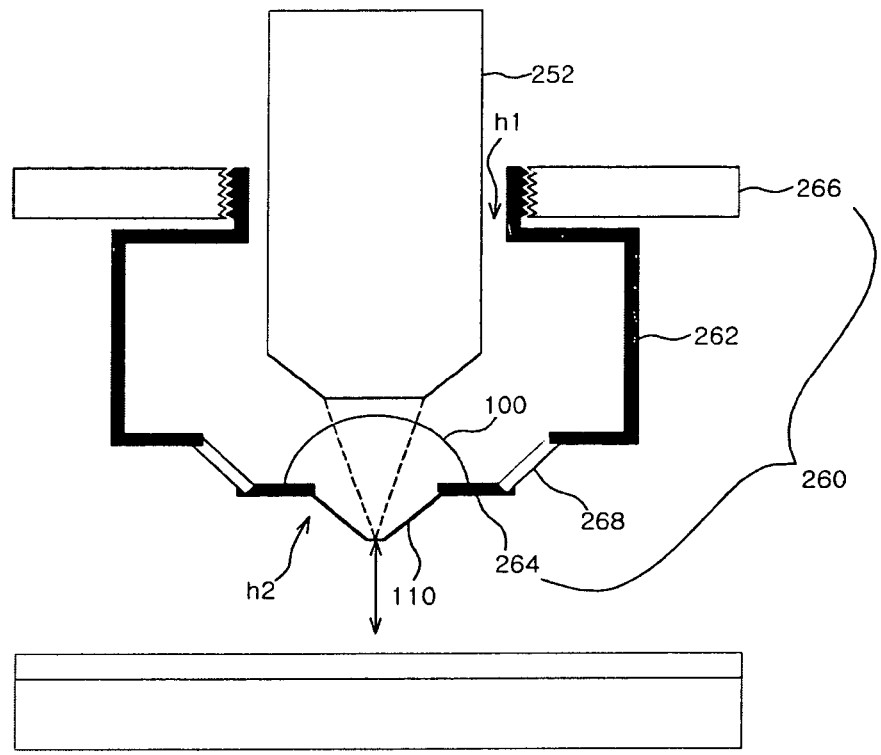
FIG. 11 is an enlarged cross-sectional view illustrating a lens unit of the optical system shown in FIG. 10.

As shown in FIG. 11, the lens unit 250 may include an object lens 252, the lens structure 100 having a nano-aperture provided therein, and a holder 260 for the lens structure 100, and is movable in the vertical direction.

The object lens 252 primarily condenses the beam transmitted from the second beam splitter 219 of the light source unit 210.

As described above, the lens structure 100 may include the semispherical lens 105 and the truncated-cone-shaped protruding portion 110 formed at the center of a flat portion of the lens. The lens structure 100 focuses the beam that is primarily condensed by the object lens 252 to a nano-diameter spot.

The holder 260 includes a first housing 262, a second housing 264, a support member 266, and a connecting member 268. The first housing 262 has a substantially rectangular parallelepiped, and includes a first hole h1 with a sufficient diameter to insert the object lens 252 at an upper part thereof. The first housing 262 is fixed to an optical system by the support member 266. The support member 266 is fixed to the optical system so as to adjust the position of the object lens 252. That is, the support member 266 can support the object lens 252 such that the object lens 252 optimally condenses beams, and adjust the position of the object lens 252. The second housing 264 is formed substantially in a plate, and includes a second hole h2 with a sufficient diameter to insert the lens structure 100, preferably, the protruding portion 110 of the lens structure 100. The second housing 264 is fixed to the edge of the first housing 262 by the connecting member 268. For example, an elastic member, such as a spring, may be used as the connecting member 268. When the second housing 264 is connected to the first housing 264 by the elastic member, such as the spring, it is possible to minutely adjust the position of the lens structure 100 such that the upper surface 110a of the protruding portion 110 of the lens structure 100 accurately comes into contact with a recording medium.

A recording medium 280, that is, a wafer 280 covered with a resist 285, is placed on the stage 270. The stage 270 can move in the X-axis and Y-axis directions such that various patterns can be written.

Next, a lithography method using the optical system 200 will be described with reference to FIG. 12. In this embodiment, for example, a silicon wafer is used as the recording medium 280, but the invention is not limited thereto. For example, various substrates, such as a compound semiconductor substrate and a ceramic substrate, may be used as the recording medium 280.

Figure 12:
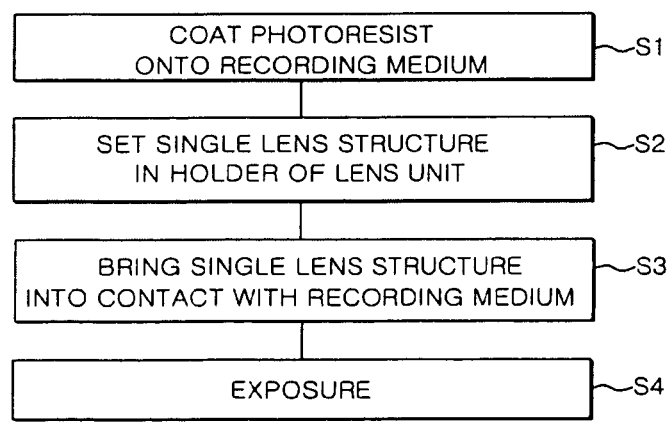
FIG. 12 is a flowchart illustrating a lithography process performed by the optical system according to the embodiment of the invention.

Referring to FIG. 12, a photoresist 285 is coated on a recording medium 280, that is, an upper surface of a silicon wafer having circuit elements are provided thereon (S1). Then, the single lens structure 100 manufactured according to the above-described embodiment is set on the holder 260 for the lens unit 250 of the optical system 200 (S2). That is, the protruding portion 110 of the lens structure 100 is inserted into the second hole h2 to be fixed to the holder 260. Then, the position of the lens unit 250 is adjusted such that the lens structure 100 comes into contact with the surface of the recording medium 280, that is, the immersion layer 130 (or the protective layer) of the lens structure 100 comes into contact with the photoresist film formed on the recording medium 280 (S3). As described above, the position of the lens unit 250 can be adjusted in the vertical direction, and can be minutely adjusted by the elastic member 268 such that the aperture 125 formed in the upper surface of the protruding portion 110 of the lens structure 100 is accurately aligned with the photoresist film 285. Then, exposure is performed by radiating a laser beam from the light source unit 210 of the optical system 200 (S4). In this case, the exposure may be performed while moving the stage 270 according to a pattern, in order to write various patterns on the photoresist film.

According to this embodiment, a single lens structure can be used to ensure a constant distance between the lens and a recording medium. In addition, it is possible to form various minute patterns having a width of 100 nm or less with only a single lens structure by transporting a wafer stage.

As described in detail above, according to the invention, a single lens structure can be used to ensure a constant distance between a lens structure and a recording medium. As a result, it is possible to rapidly perform uniform exposure with ease.

Further, it is possible to process a general lens into a lens structure serving as a photo mask. As a result, it is possible to considerably reduce costs of manufacturing a nanoscale pattern smaller than a microscale pattern.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A lens structure comprising:
   a lens that has a substantially semispherical shape and includes a protruding portion having an exposing flat surface provided on its aspherical surface;
   a thin metal film that is formed on the exposing surface of the protruding portion, and has an aperture formed at a position corresponding to the center of the exposing surface of the protruding portion; and
   an immersion layer that is formed with a constant thickness on the surface of the protruding portion formed on the thin metal film, wherein the thin metal film is formed on a portion of the flat surface of the protruding portion so as to be opened a center portion of the flat surface of the protruding portion and to generate an evanescent field through the aperture.

2. The lens structure of claim 1,
   wherein the protruding portion have a truncated cone shape.

3. The lens structure of claim 1,
   wherein the thin metal film is an aluminum film or a gold film.

4. The lens structure of claim 1,
   wherein the immersion layer is formed of a transmissive material having a larger refractive index than air.

5. The lens structure of claim 4,
   wherein the immersion layer is selected from the a solid material consisting of an ultraviolet cured resin or a polymer.

6. The lens structure of claim 4, further comprising:
   a recoding medium having an upper surface being opposite to the flat surface of the protruding portion,
   a photoresist formed on the upper surface of the recoding medium and to be contacted with the thin metal film,
   a lubricant applied on the photoresist.

7. The lens structure of claim 4, further comprising:
   a protective layer formed on the immersion layer.

8. The lens structure of claim 7,
   wherein the protective layer is a diamond like carbon layer.

9. The lens structure of claim 4,
   wherein the immersion layer is in a liquid state.

10. The lens structure of claim 9,
    wherein the immersion layer is formed so as to fill up the aperture, and
    the immersion layer is surrounded by a guard.

11. The lens structure of claim 1,
    wherein the immersion layer has a thickness of 10 to 100 nm.

* * * * *